(12) United States Patent
Tangirala

(10) Patent No.: US 11,476,868 B2
(45) Date of Patent: Oct. 18, 2022

(54) DUAL LOOP SAR ADC WITH PROCESS DRIVEN ARCHITECTURE

(71) Applicant: RAMBUS INC., San Jose, CA (US)

(72) Inventor: Shankar Tangirala, Fremont, CA (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 17/153,157

(22) Filed: Jan. 20, 2021

(65) Prior Publication Data

US 2021/0234548 A1 Jul. 29, 2021

Related U.S. Application Data

(60) Provisional application No. 62/965,723, filed on Jan. 24, 2020.

(51) Int. Cl.
*H03M 1/36* (2006.01)
*H03M 1/46* (2006.01)

(52) U.S. Cl.
CPC ........... *H03M 1/462* (2013.01); *H03M 1/466* (2013.01)

(58) Field of Classification Search
CPC ........ H03M 1/462; H03M 1/38; H03M 1/468; H03M 1/466; H03M 1/125; H03M 1/002; H03M 1/46; H03M 1/12; H03M 1/1215; H03M 1/1245; H03M 5/08; H03M 1/804; H03M 1/08; H03M 1/00; H03M 1/1009; H03M 1/1235; H03M 7/10; H03M 1/0682; H03M 1/145; H03M 1/68; H03M 1/361; H03M 1/1019; H03M 3/426
USPC .................................. 341/155, 161, 162, 172
See application file for complete search history.

(56) References Cited

U.S. PATENT DOCUMENTS

| | | | | |
|---|---|---|---|---|
| 8,362,940 | B2 * | 1/2013 | Yoshioka | H03M 1/125 341/118 |
| 8,416,116 | B2 * | 4/2013 | Chang | H03M 1/002 341/172 |
| 8,456,340 | B2 * | 6/2013 | Kapusta | H03M 1/125 341/120 |
| 9,054,737 | B1 * | 6/2015 | Seesink | H03M 1/46 |

(Continued)

OTHER PUBLICATIONS

Kull, Lukas et al. "A 3.1mW 8b 1.2GS/s Single-Channel Asynchronous SAR ADC with Alternate Comparators for Enhanced Speed in 32nm Digital SOI CMOS", 2013 IEEE International Solid-State Circuits Conference, Session 26, 26.4, Feb. 20, 2013, ISSCC 2013, pp. 468-470. 3 pages.

*Primary Examiner* — Linh V Nguyen
(74) *Attorney, Agent, or Firm* — Womble Bond Dickinson (US) LLP

(57) ABSTRACT

A dual-loop analog to digital converter (ADC) includes an asynchronous inner loop including first and second comparators and a state machine, where outputs of the first and second comparators are coupled to inputs of the state machine, and where outputs of the state machine are cross-coupled to enable ports of the first and second comparators. The ADC includes a synchronous outer loop including a successive approximation register (SAR), a digital to analog converter (DAC), and the first and second comparators, where the outputs of the first and second comparators are coupled to inputs of the SAR, an N-bit output of the SAR is coupled to an N-bit input of the DAC, and a differential output of the DAC is coupled to inputs of the first and second comparators, where a state of the state machine is independent of the state of the SAR.

20 Claims, 4 Drawing Sheets

(56) References Cited

U.S. PATENT DOCUMENTS

| | | | |
|---|---|---|---|
| 9,520,891 B1 | 12/2016 | Kull et al. | |
| 9,621,179 B1 * | 4/2017 | Maulik | H03M 1/0863 |
| 10,236,901 B1 * | 3/2019 | Neto | H03M 1/125 |
| 10,763,879 B1 * | 9/2020 | Neto | H03M 1/462 |
| 10,903,846 B1 * | 1/2021 | Liu | H03M 1/68 |
| 10,985,773 B2 * | 4/2021 | Zhou | H03M 1/466 |
| 2017/0346500 A1 * | 11/2017 | Chen | H03M 1/125 |
| 2018/0183455 A1 * | 6/2018 | Lee | H03M 1/466 |

* cited by examiner

DUAL LOOP SAR ADC WITH PROCESS DRIVEN ARCHITECTURE

CROSS-REFERENCE TO RELATED APPLICATIONS

This application claims the benefit of U.S. Provisional Patent Application No. 62/965,723, filed on Jan. 24, 2020, the disclosure of which is incorporated herein by reference in its entirety.

FIELD

The present disclosure is directed in general to high-speed analog-to-digital converters (ADCs), and in particular to ADC architectures based on layout constraints imposed by device fabrication processes.

BACKGROUND

Traditionally, analog-to-digital converters (ADCs) have used an asynchronous SAR (sequential approximation register) architecture to achieve moderate speeds with minimal risk of comparator meta-stability, or a synchronous SAR architecture to achieve high speeds with some risk of comparator meta-stability. Individually, these two architectures have conflicting requirements that prevent the achievement of both high speed and low comparator meta-stability.

DETAILED DESCRIPTION

Figure 1:
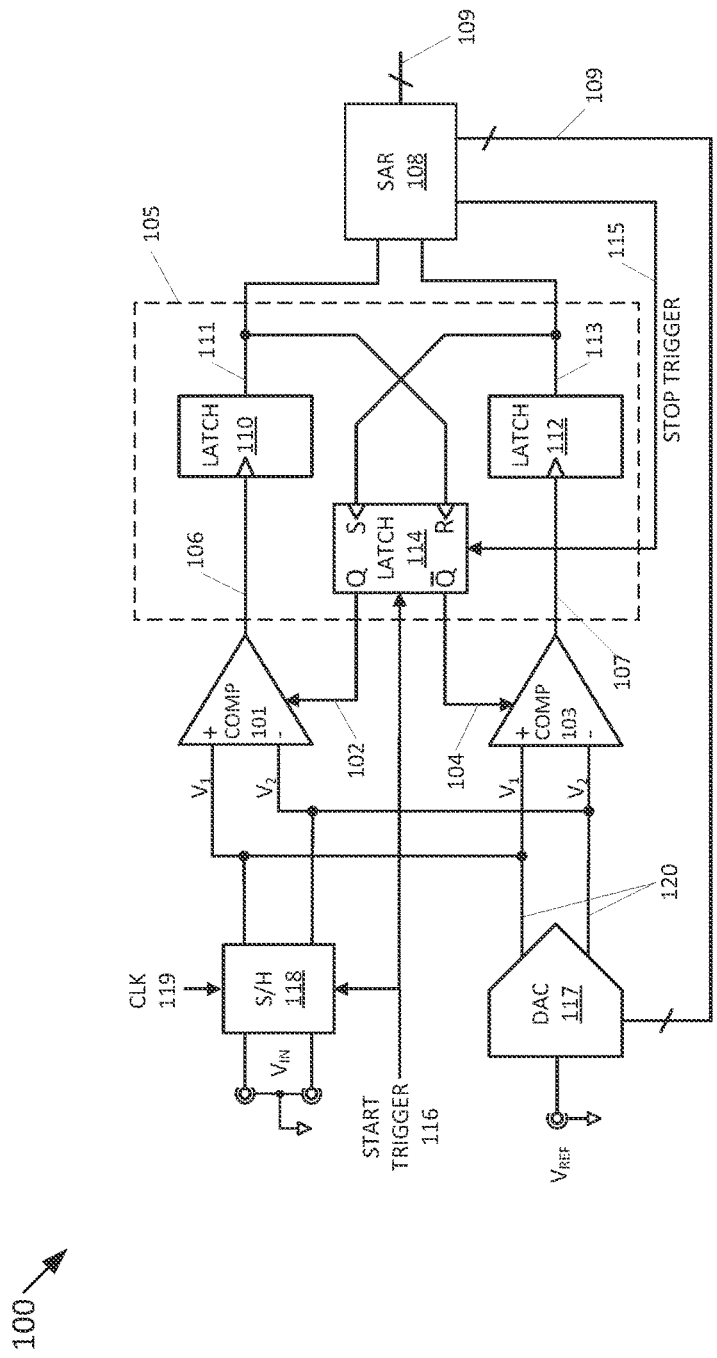
FIG. 1 is a block diagram illustrating an example ADC architecture according to the present disclosure.

In deep sub-micron FinFET process technologies, achieving circuit speed in proportion to device speed is becoming more and more difficult, as device feature size is reduced, due to the unique device geometries and layout parasitics. The present disclosure provides examples of an architecture that can be used to, for example, address layout dependent limitations on speed in these processes.

In particular, the present disclosure provides examples of a mixed synchronous/asynchronous SAR-based ADC architecture. The asynchronous portion of the design can be layout driven based on process constraints of the deep sub-micron FinFET process while the synchronous portion of the design can be circuit driven independent of such process constraints. Thus, the mixed synchronous/asynchronous architecture can separate the limitations of the individual architectures to extract the benefits of each architecture without performance compromises.

In one example, an ADC according to the present disclosure includes a first comparator configured to compare a first voltage with a second voltage when enabled by a first enable signal; a second comparator configured to compare the first voltage with the second voltage when enabled by a second enable signal; a state machine coupled with an output of the second comparator and an output of the first comparator, where the state machine is configured to generate the first enable signal from the output of the second comparator, and to generate the second enable signal from the output of the first comparator; and a successive approximation register (SAR) coupled with the state machine, where the state machine is further configured to drive the SAR, based on alternating outputs of the first comparator and the second comparator, where the first enable signal and the second enable signal are independent of the SAR, and where a difference between the first voltage and the second voltage is the difference between an analog input voltage and a reference voltage scaled by a digital output of the SAR.

In one example, the state machine includes a first latch coupled with the output of the first comparator, where the first latch is configured to latch the output of the first comparator to drive the SAR; a second latch coupled with the output of the second comparator, where the second latch is configured to latch the output of the second comparator to drive the SAR; and a third latch coupled with an output of the first latch and an output of the second latch, where the third latch is configured to generate the first enable signal from the output of the second latch and the second enable signal from the output of the first latch.

In one example, the SAR is configured to generate a digital approximation of the analog input voltage based on the alternating outputs of the first comparator and the second comparator.

In one example, the ADC also includes a digital to analog converter (DAC) coupled with the SAR, the first comparator and the second comparator, where the DAC is configured to receive the reference voltage and the digital approximation of the analog input voltage; and a sample and hold gate coupled with the first comparator and the second comparator, to sample an analog input signal, and to provide the analog input voltage to the DAC, where a differential output voltage of the DAC is pre-charged to a difference between the analog input voltage and the scaled reference voltage.

In one example, the state machine is enabled by an external start trigger, and disabled by a stop trigger generated by the SAR.

In one example, the SAR is an N-bit SAR, where the SAR is configured to generate the stop trigger when all N bits of the SAR have been set, based on the alternating outputs of the first comparator and the second comparator.

In one example, an ADC according to the present disclosure includes an asynchronous inner loop including first and second comparators and a state machine, where outputs of the first and second comparators are coupled to inputs of the state machine, and where outputs of the state machine are cross-coupled to enable ports of the first and second comparators, and where the outputs of the first and second comparators are alternately enabled; and a synchronous outer loop including a successive approximation register (SAR), a digital to analog converter (DAC), and the first and second comparators, where the outputs of the first and second comparators are coupled to inputs of the SAR, an N-bit output of the SAR is coupled to an N-bit input of the DAC, and a differential output of the DAC is coupled to inputs of the first and second comparators, and where a state of the state machine is independent of a state of the SAR.

In one example, the ADC also includes a sample and hold gate, coupled in parallel with the differential output of the DAC, where the sample and hold gate is configured to sample an analog input signal and to initialize the differential output of the DAC to the difference between the analog input signal and the scaled reference voltage.

In one example, the DAC is configured to receive an external reference voltage and a control signal from the SAR comprising the digital approximation of the analog input voltage, and further configured to generate a differential output comprising a difference between the analog input voltage and a scaled reference voltage based on the control signal.

In one example, the asynchronous inner loop and the synchronous outer loop are triggered by an external start trigger.

In one example, the asynchronous inner loop is halted by a stop trigger generated by the N-bit SAR when all N bits of the N-bit SAR have been set by the state machine.

FIG. 1 is a block diagram illustrating an example ADC 100 according to the present disclosure. ADC 100 includes a first comparator 101 configured to compare a first voltage V1 with a second voltage V2 when enabled by a first enable signal 102. ADC 100 includes a second comparator 103 configured to compare the first voltage V1 with the second voltage V2 when enabled by a second enable signal 104. ADC 100 also includes a state machine 105 coupled with an output 107 of the second comparator 103 and an output 106 of the first comparator, where the state machine 105 is configured to generate the first enable signal 102 from the output of the second comparator 103, and to generate the second enable signal 103 from the output 106 of the first comparator 101. The ADC 100 also includes a successive approximation register (SAR) 108 coupled with the state machine 105, where the state machine is further configured to drive the SAR based on alternating outputs 106 and 107 of the first comparator 101 second comparator 103, respectively, where the first enable signal 102 and the second enable signal 104 are independent of the SAR, and where a difference between the first voltage V1 and the second voltage V2 comprises a difference between an analog input voltage VIN and a reference voltage $V_{REF}$ scaled by a digital output 109 of the SAR 108.

In one example, the state machine 105 in example ADC 100 includes a first latch 110 coupled with the output 106 of the first comparator 101, where the first latch 110 is configured to latch the value of the output 106 of the first comparator 101 to the output 111 of the first latch 110 to drive the SAR 108.

In one example, the output 106 of the first comparator 101 may be a logical zero or a logical one based on the relationship between first voltage V1 and second voltage V2. If V1>V2, then the output 106 of the first comparator 101 will be a logical one (1) when the first comparator 101 is enabled by the first enable signal 102. If V1<V2, then the output 106 of the first comparator 101 will be a logical zero (0) when the first comparator is enabled by the first enable signal 102.

In one example, the first latch 110 may be a D-latch, such that the output 111 of first latch 110 latches to the value of output 106 of first comparator 101 whenever the output 106 of first comparator 101 changes state on enable signal 102. That is, if the output 106 of first comparator 101 transitions from 0 to 1, then the output 111 of first latch 110 will latch to 1. Conversely, if the output 106 of first comparator 101 transitions from 1 to 0, then the output 111 of first latch 110 will latch to 0.

In one example, the state machine 105 also includes a second latch 112 coupled with the output 107 of the second comparator 102, where the second latch 112 is configured to latch the value of the output 107 of the second comparator 103 to the output 113 of the second latch 112 to drive the SAR 108.

In one example, the output 107 of the second comparator 103 may be a logical zero or a logical one based on the relationship between first voltage V1 and second voltage V2. If V1>V2, then the output 107 of the second comparator 103 will be a logical one (1) when the second comparator 103 is enabled by the second enable signal 104. If V1<V2, then the output 107 of the second comparator 103 will be a logical zero (0) when the second comparator is enabled by the second enable signal 104.

In one example, the second latch 112 may be a D-latch, such that the output 113 of the second latch 112 latches to the value of output 107 of second comparator 103 whenever the output 107 of second comparator 103 changes state on enable signal 104. That is, if the output 107 of second comparator 103 transitions from 0 to 1, then the output 113 of second latch 112 will latch to 1. Conversely, if the output 107 of second comparator 103 transitions from 1 to 0, then the output 113 of second latch 112 will latch to 0.

In one example, the state machine 105 also includes a third latch 114 coupled with output 111 of the first latch 110 and output 113 of the second latch 112, where the third latch 114 is configured to generate the first enable signal 102 from the output 113 of the second latch and the second enable signal 104 from the output 111 of the first latch 110.

In one example, third latch 114 may be an SR latch, where the S (set) input of the third latch 114 is connected to the output 113 of the second latch 112, the R (reset) input of the third latch 114 is connected to the output 111 of the first latch 110, the Q output of the third latch 114 is the enable signal 102 for the first comparator 101, and the NOT Q output of the third latch 114 is the enable signal 104 for the second comparator 102. It will be appreciated that the described latch/comparator architecture operates as a bi-stable multi-vibrator that permits only one of the two comparators to be enabled at any time (because the Q and NOT Q outputs are always different), and that once triggered by an external start trigger (e.g., trigger 116), will alternately and asynchronously enable first comparator 101 and second comparator 103. When V1 is greater than V2, then the state machine 105 will output a sequence of logical ones to drive SAR 108. When V2 is greater than V1, then the state machine 105 will output a sequence of logical zeros to SAR 108. When the SAR 108 receives a logical 1 from either latch 110 or latch 112, SAR 108 will set the most significant bit in its digital output 109 that has not previously been set or reset, and when the SAR 108 receives a logical 0 from either latch 110 or latch 112, then SAR 108 resets the last bit that was set, and sets the next most significant bit in its digital output 109. If the SAR 108 is an N-bit SAR, then this iterative, asynchronous process continues until all N-bits of the SAR have been set. When all N-bits have been set, the SAR 108 sends a stop trigger 115 to the third latch 114 to halt the state machine 105.

In one example, ADC 100 includes a digital-to-analog converter (DAC) 117 coupled with the SAR 108 via the digital output 109 of the SAR 108, and with the first comparator 101 and the second comparator 103. DAC 117 may be a switched-capacitor DAC that receives an external reference voltage $V_{REF}$ and scales the reference voltage according to the digital output 109 of the SAR 108 to a value between zero volts and $V_{REF}$, based on the digital output 109 of SAR 108. ADC 100 may also include a sample and hold (S/H) gate 118 configured to capacitively sample and hold a differential analog input voltage VIN in response to the start trigger 116, and synchronously thereafter in response to a clock signal (CLK) 119. In one example, the S/H 118 and the DAC 117 comprise a capacitive voltage divider where the difference between the first voltage V1 and the second voltage V2 is the difference between the differential analog input voltage Vin and the scaled reference voltage in the DAC 117.

In one example implementation, using deep sub-micron FinFET processes, the circuit architecture of ADC 100 in FIG. 1 may be realized physically in an integrated circuit (IC) with a compact asynchronous inner loop including comparators, and dependent on process constraints, to maximize speed with minimal risk of comparator meta-stability, and an outer synchronous loop without comparators and independent of process constraints, to achieve the naturally high speed of synchronous architecture without the risk of comparator meta-stability problems.

Figure 2:
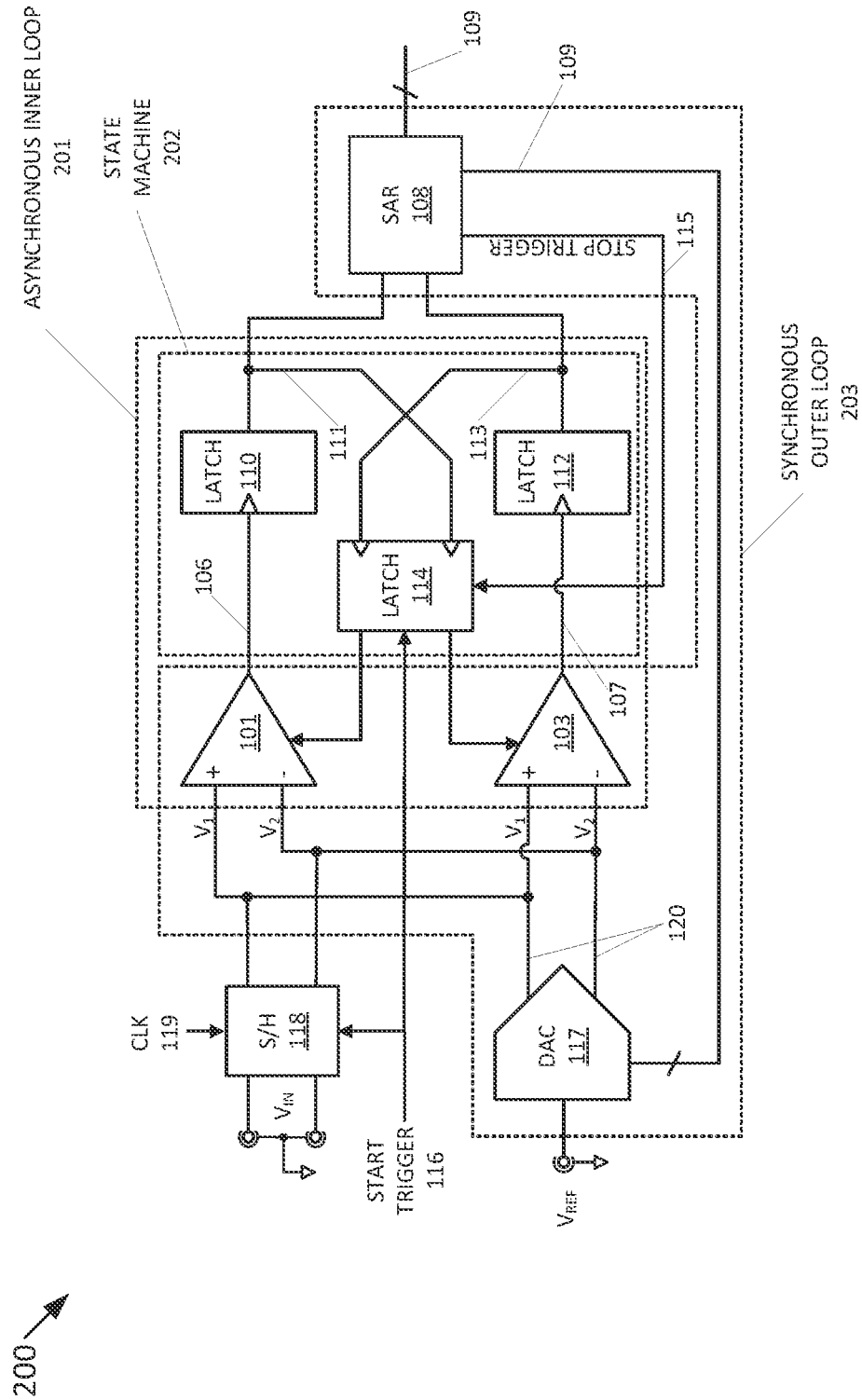
FIG. 2 is a block diagram illustrating an example ADC architecture according to the present disclosure.

FIG. 2, a modification of FIG. 1, illustrates an example ADC 200 with explicit partitioning into synchronous and asynchronous loops.

Example ADC 200 includes an asynchronous inner loop 201 comprising the first comparator 101 and the second comparator 103, and a state machine 202, where the output 106 of the first comparator 101 and the output 107 of the second comparator 103 are coupled to inputs of the state machine 202, and where outputs 111 and 113 of the state machine 202 are cross-coupled to enable ports 102 and 104, respectively, of the first and second comparators (101 and 103, respectively) through the state machine 202, where the outputs (106 and 107, respectively) of the first and second comparators (101 and 103, respectively) are alternately enabled.

Example ADC 200 also includes a synchronous outer loop 203 comprising the successive approximation register (SAR) 108, the digital to analog converter (DAC) 117, and the first and second comparators (101 and 103, respectively), where the outputs of the first and second comparators (106 and 107, respectively) are coupled to inputs of the SAR 108 through the state machine 202, and where an N-bit output 109 of the SAR is coupled to an N-bit input of the DAC 117, and a differential output of the DAC is coupled to inputs of the first and second comparators (101 and 103), where the state of the state machine 202 is independent of the state of the SAR 108.

The architecture and operation of the state machine 202 in example ADC 200 in FIG. 2 can be the same in all respects as the architecture and operation of the state machine 105 in example ADC 100 in FIG. 1, and is not repeated here to avoid unnecessary prolix and repetition. For the purposes of the present disclosure, the preceding description of the architecture and operation of state machine 105 is incorporated into the description of state machine 202 in example ADC 200.

Example ADC 200 also includes a synchronous outer loop 203 comprising the successive approximation register (SAR) 108, the digital to analog converter (DAC) 117, and the first and second comparators (103 and 103, respectively), where the outputs 106 and 107 of the respective first and second comparators (101 and 103) are coupled through the state machine 202 to inputs of the SAR via signals 111 and 113. The N-bit output of the SAR 108 is coupled to an N-bit input of the DAC 117, a differential output 120 of the DAC 117 is coupled to the inputs of the first and second comparators, and the state of the state machine 202 is independent of the state of the SAR 108.

The remaining architecture and operation of example ADC 200 is similar in all respects to the architecture and operation of example ADC 100.

For example, the example ADC 200 includes a sample and hold (S/H) gate 118, coupled in parallel with the differential output 120 of the DAC 117, where the sample and hold gate 118 is configured to sample an analog input signal VIN and to initialize the differential output 120 of the DAC to an analog input voltage corresponding to the analog input signal.

In another example, the SAR 108 is configured to generate a digital approximation 109 of the analog input voltage based on the alternating outputs of the first comparator and the second comparator.

In another example, the DAC 117 is configured to receive an external reference voltage $V_{REF}$ and a control signal from the SAR comprising the digital approximation 109 of the analog input voltage, and further configured to generate a differential output comprising the difference between the analog input voltage and a scaled reference voltage based on the control signal.

In one example, the asynchronous inner loop 201 and the synchronous outer loop are triggered by the external start trigger 116, and the asynchronous inner loop 201 is halted by a stop trigger 115 generated by the N-bit SAR 108 when all N bits of the N-bit SAR have been set by the state machine 202.

Figure 3:
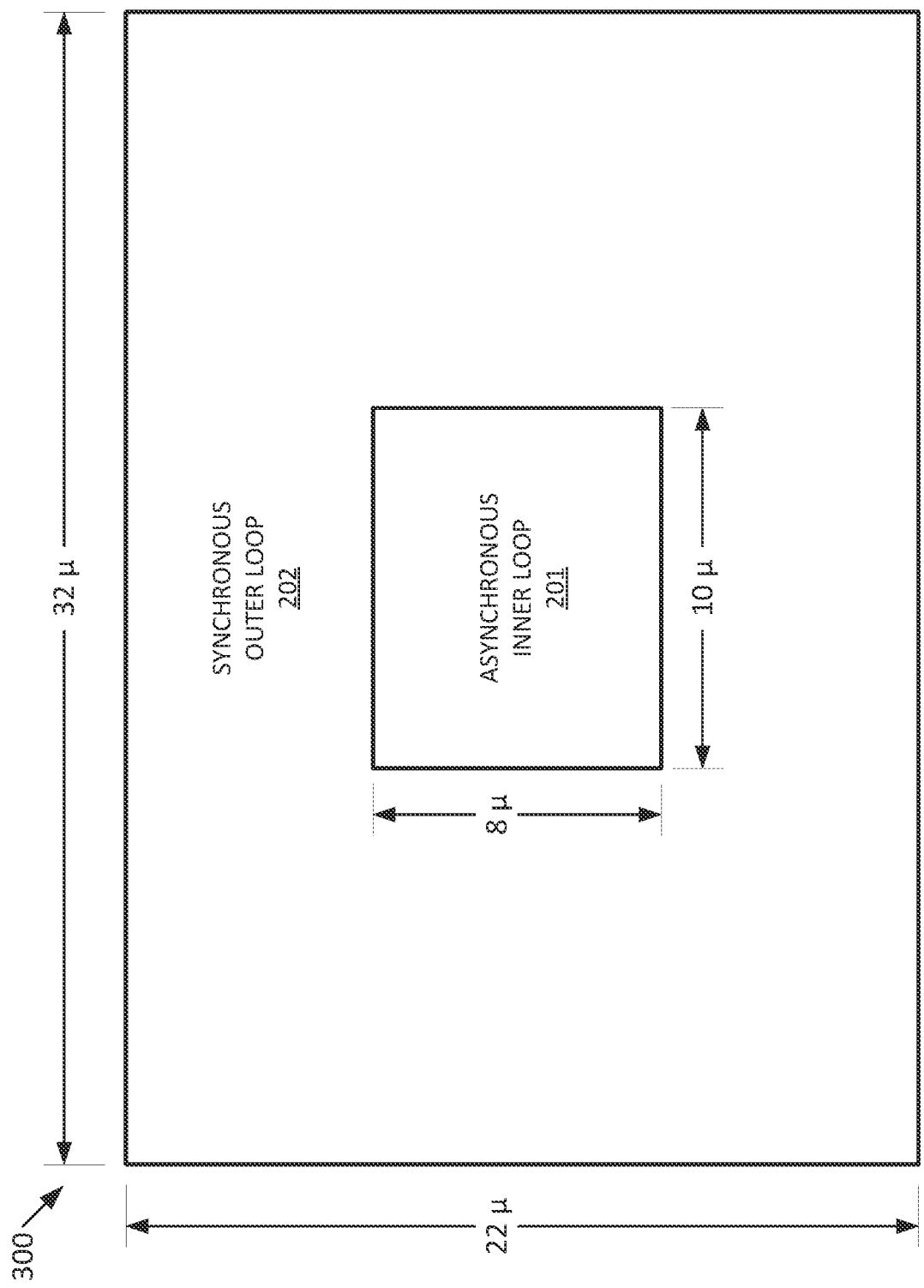
FIG. 3 is a schematic illustration of the physical layout of an example ADC according to the present disclosure.

FIG. 3 is a schematic representation of one physical layout 300 of the example ADC 200 according to the present disclosure, using a 10 nanometer (nm) FinFET process technology. The entire ADC 200 is approximately 22 microns (μ) wide by approximately 32μ long (~704μ$^2$). The inner asynchronous loop 201 is approximately 8μ wide by 10μ long (~80μ$^2$). This architecture has achieved speeds up to 920 MHz.

Figure 4:
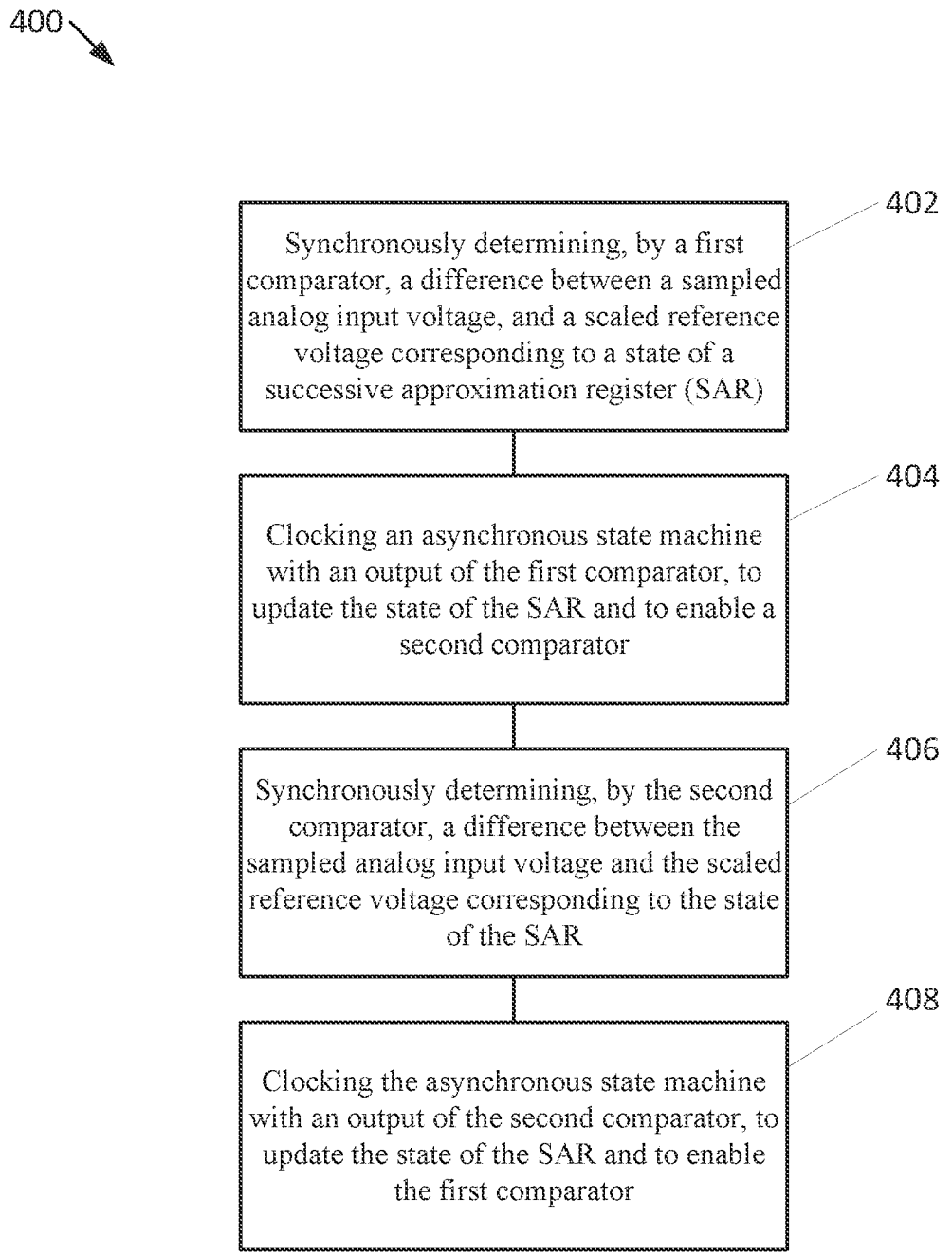
FIG. 4 is a flowchart illustrating an example method in an ADC according to the present disclosure.

FIG. 4 is a flowchart illustrating a method in a dual-loop SAR-based ADC according to the present disclosure. Method 400 begins at operation 402 by synchronously determining, by a first comparator (e.g., comparator 101), a difference between a sampled analog input voltage (e.g., sample of VIN), and a scaled reference voltage (e.g. scaled $V_{REF}$) corresponding to a state of a successive approximation register (SAR), such as SAR 108.

Method 400 continues at operation 404 by clocking an asynchronous state machine (e.g. state machine 105 or 201) with an output of the first comparator (e.g. output 107 of comparator 101), to update the state of the SAR and to enable a second comparator (e.g. enabling comparator 103 by enable signal 104). Next, operation 406 comprises synchronously determining, by the second comparator, a difference between the sampled analog input voltage and the scaled reference voltage corresponding to the state of the SAR. Method 400 concludes with operation 408, clocking the asynchronous state machine with an output of the second comparator (e.g., output 108 of comparator 103, to update the state of the SAR and to enable the first comparator (e.g., enabling comparator 101 with enabling signal 102).

In other examples, the method 400 may also include sampling an analog input signal (e.g., VIN) with a sample and hold circuit (e.g., S/H 118) to generate the sampled analog input voltage, initializing a digital to analog converter (DAC) (e.g., DAC 117) with the sampled analog input signal.

In other examples, the method 400 may also include scaling a reference voltage (e.g., $V_{REF}$) in the DAC with an output of the SAR (e.g., digital output 109), to generate the scaled reference voltage, combining the sampled analog input voltage with the scaled reference voltage in the DAC to generate a voltage comprising the difference between the sampled analog input voltage and the scaled reference voltage. (e.g., differential voltage 120).

The preceding description sets forth numerous specific details such as examples of specific systems, components, methods, and so forth, in order to provide a thorough understanding of several examples in the present disclosure. It will be apparent to one skilled in the art, however, that at least some examples of the present disclosure may be practiced without these specific details. In other instances, well-known components or methods are not described in detail or are presented in simple block diagram form in order to avoid unnecessarily obscuring the present disclosure. Thus, the specific details set forth are merely exemplary. Particular examples may vary from these exemplary details and still be contemplated to be within the scope of the present disclosure.

Any reference throughout this specification to "one example" or "an example" means that a particular feature, structure, or characteristic described in connection with the examples are included in at least one example. Therefore, the appearances of the phrase "in one example" or "in an example" in various places throughout this specification are not necessarily all referring to the same example.

Although the operations of the methods herein re shown and described in a particular order, the order of the operations of each method may be altered so that certain operations may be performed in an inverse order or so that certain operation may be performed, at least in part, concurrently with other operations. Instructions or sub-operations of distinct operations may be performed in an intermittent or alternating manner.

As used in this disclosure, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. As used in this disclosure, the terms "coupled with" or "coupled to" mean coupled, attached or in communication with another element or component, either directly or indirectly through intervening elements or components. As used in this disclosure, the term "configured to" means designed for or capable of a specific purpose, task or function, and does not imply a change of state unless or require any action by a user unless otherwise described.

What is claimed is:

1. An analog to digital converter (ADC), comprising:
   a first comparator configured to compare a first voltage with a second voltage when enabled by a first enable signal;
   a second comparator configured to compare the first voltage with the second voltage when enabled by a second enable signal;
   a state machine coupled with an output of the second comparator and an output of the first comparator, the state machine configured to generate the first enable signal from the output of the second comparator and independent of the output of the first comparator, and to generate the second enable signal from the output of the first comparator and independent of the output of the second comparator; and
   a successive approximation register (SAR) coupled with the state machine, the SAR configured to drive the state machine with a stop trigger via a feedback path coupled to the state machine, the stop trigger disables the state machine when the SAR determines that the first comparator or the second comparator has completed a comparison, wherein the state machine is further configured to drive the SAR based on alternating outputs of the first comparator and the second comparator, wherein the first enable signal and the second enable signal are independent of the SAR, and wherein a difference between the first voltage and the second voltage comprises a difference between an analog input voltage and a reference voltage scaled by a digital output of the SAR.

2. The ADC of claim 1, wherein the state machine comprises:
   a first latch coupled with the output of the first comparator, the first latch configured to latch the output of the first comparator to drive the SAR;
   a second latch coupled with the output of the second comparator, the second latch configured to latch the output of the second comparator to drive the SAR; and
   a third latch coupled with an output of the first latch and an output of the second latch, the third latch configured to generate the first enable signal from the output of the second latch and the second enable signal from the output of the first latch, wherein
   the first enable signal and the second enable signal are generated asynchronously by the state machine independent of the SAR.

3. The ADC of claim 1, wherein the SAR is configured to sequentially generate a digital approximation of the analog input voltage based on the alternating outputs of the first comparator and the second comparator.

4. The ADC of claim 3, further comprising:
   a digital to analog converter (DAC) coupled with the SAR, the first comparator and the second comparator, the DAC configured to receive the reference voltage and the digital approximation of the analog input voltage; and
   a sample and hold gate coupled with the first comparator and the second comparator, to sample an analog input signal, and to provide the analog input voltage to the DAC, wherein a differential output voltage of the DAC is pre-charged to a difference between the analog input voltage and the scaled reference voltage.

5. The ADC of claim 1, wherein the state machine is enabled by an external start trigger.

6. The ADC of claim 5, wherein the SAR comprises an N-bit SAR, wherein the SAR is configured to generate the stop trigger when all N bits of the SAR have been set, based on the alternating outputs of the first comparator and the second comparator.

7. An analog to digital converter (ADC), comprising:
   an asynchronous inner loop comprising first and second comparators and a state machine, wherein outputs of the first and second comparators are coupled to inputs of the state machine, and wherein outputs of the state machine are cross-coupled to enable ports of the first and second comparators, wherein the outputs of the first and second comparators are alternately enabled, wherein the first comparator is enabled independent from the output of the second comparator and the second comparator is enabled independent from the output of the first comparator; and
   a synchronous outer loop comprising a successive approximation register (SAR), a digital to analog converter (DAC), and the first and second comparators, wherein the SAR configured to drive the state machine with a stop trigger via a feedback path coupled to the state machine, the stop trigger disables the state machine when the SAR determines that the first comparator or the second comparator has completed a comparison, the outputs of the first and second comparators are coupled to inputs of the SAR, an N-bit output of the SAR is coupled to an N-bit input of the DAC, and a differential output of the DAC is coupled to inputs of the first and second comparators, wherein a state of the state machine is independent of a state of the SAR.

8. The ADC of claim 7, wherein the state machine comprises:
a first latch coupled with an output of the first comparator, the first latch configured to latch the output of the first comparator to drive the SAR;
a second latch coupled with an output of the second comparator, the second latch configured to latch an output of the second comparator to drive the SAR;
a third latch coupled with an output of the first latch and an output of the second latch, the third latch configured to generate the first enable signal from the output of the second latch and the second enable signal from the output of the first latch.

9. The ADC of claim 7, further comprising a sample and hold gate, coupled in parallel with a differential output of the DAC, the sample and hold gate configured to sample an analog input signal and to initialize the differential output of the DAC to an analog input voltage corresponding to the analog input signal.

10. The ADC of claim 7, wherein the SAR is configured to generate a digital approximation of the analog input voltage based on the alternating outputs of the first comparator and the second comparator.

11. The ADC of claim 7, wherein the DAC is configured to receive an external reference voltage and a control signal from the SAR comprising the digital approximation of the analog input voltage, and further configured to generate a differential output comprising a difference between the analog input voltage and a scaled reference voltage based on the control signal.

12. The ADC of claim 7, wherein the asynchronous inner loop and the synchronous outer loop are triggered by an external start trigger.

13. The ADC of claim 7, wherein the asynchronous inner loop is halted by a stop trigger generated by the N-bit SAR when all N bits of the N-bit SAR have been set by the state machine.

14. A method, comprising:
synchronously determining, by a first comparator, a difference between a sampled analog input voltage, and a scaled reference voltage corresponding to a state of a successive approximation register (SAR); and
clocking an asynchronous state machine with an output of the first comparator and independent of an output of a second comparator, to update the state of the SAR and to enable the second comparator;
synchronously determining, by the second comparator, a difference between the sampled analog input voltage and the scaled reference voltage corresponding to the state of the SAR; and
clocking the asynchronous state machine with the output of the second comparator and independent of the output of the first comparator, to update the state of the SAR and to enable the first comparator, wherein the SAR configured to drive the state machine with a stop trigger via a feedback path coupled to the state machine, the stop trigger disables the state machine when the SAR determines that the first comparator or the second comparator has completed a comparison.

15. The method of claim 14, further comprising:
sampling an analog input signal with a sample and hold circuit to generate the sampled analog input voltage; and
initializing a digital to analog converter (DAC) with the sampled analog input signal.

16. The method of claim 15, further comprising:
scaling a reference voltage in the DAC with an output of the SAR, to generate the scaled reference voltage; and
combining the sampled analog input voltage with the scaled reference voltage in the DAC to generate a voltage comprising the difference between the sampled analog input voltage and the scaled reference voltage.

17. The method of claim 15, wherein the SAR comprises an N-bit SAR, the method further comprising:
starting the asynchronous state machine with an external trigger; and
halting the asynchronous state machine with a stop trigger generated by the N-bit SAR when all N bits of the N-bit SAR have been set by the state machine.

18. The method of claim 15, wherein the DAC comprises a switched-capacitor DAC, and wherein the scaled reference voltage is determined by a capacitive voltage divider controlled by the output of the SAR.

19. The method of claim 17, wherein the sample and hold circuit, the DAC, the first and second comparators and the SAR comprise a synchronous loop, the method further comprising:
starting the synchronous loop with the external trigger signal; and
clocking the sample and hold circuit with an external clock signal.

20. The method of claim 16, wherein an initial value of the scaled reference voltage is one-half of the reference voltage.

* * * * *